United States Patent [19]

Eichelberger et al.

[11] Patent Number: 4,528,748

[45] Date of Patent: Jul. 16, 1985

[54] METHOD FOR FABRICATING A PRINTED CIRCUIT BOARD OF DESIRED SHAPE

[75] Inventors: Charles W. Eichelberger, Schenectady; Robert J. Wojnarowski, Ballston Lake; Abraham Auerbach, Albany, all of N.Y.

[73] Assignee: General Electric Company, Schenectady, N.Y.

[21] Appl. No.: 445,127

[22] Filed: Nov. 29, 1982

[51] Int. Cl.³ .............................................. H05K 3/22
[52] U.S. Cl. ........................................ 29/835; 29/829; 339/17 B
[58] Field of Search ................. 29/829, 825, 853, 846, 29/848, 849, 830, 832, 835; 339/17 F, 176 MF, 17 R, 17 A, 17 B, 17 N; 72/133, 166, 169

[56] References Cited

U.S. PATENT DOCUMENTS

| 3,025,339 | 3/1962 | Gordon et al. | 339/17 F |
| 3,039,177 | 6/1962 | Burdett | 29/848 |
| 3,331,718 | 7/1967 | Ruffing | 29/829 |
| 3,427,715 | 2/1969 | Mika | 339/17 R |
| 3,755,891 | 9/1973 | Muckelroy et al. | 29/846 |
| 3,879,994 | 4/1975 | Hume | 72/169 |
| 4,404,237 | 9/1983 | Eichelberger et al. | 427/102 |

FOREIGN PATENT DOCUMENTS 607543 12/1978 Switzerland ..................... 29/829

OTHER PUBLICATIONS

Memis, I.; Rubino, R. V.; & Wagner, F. O., Bent Thermoset Printed-Circuit Boards, IBM Technical Disclosure Bulletin, vol. 14, No. 11, Apr. 1972.

Hobbs, D. E., "Electrical Connection to Grounded Planes," IBM Tech. Disclosure Bull., vol. 12, No. 5, Oct. 1969.

Iafrate P. F. & Relyea, Jr., "Continuous Processing for Substrate Manufacture", IBM Tech. Disclosure Bull., vol. 15, No. 9, Feb. 1973.

Primary Examiner—Howard N. Goldberg
Assistant Examiner—P. W. Echols
Attorney, Agent, or Firm—Geoffrey H. Krauss; James C. Davis, Jr.; Marvin Snyder

[57] ABSTRACT

A method is described for batch-fabricating flat printed circuit boards and subsequently forming the circuit boards to a particular desired shape. In particular, a conductive substrate is coated with an insulating coating and conductors are fabricated thereon, with integrated circuit and chip resistor/capacitor parts being mounted to the fabricated conductor patterns. After part-mounting, the circuit board is bent to the desired shape.

11 Claims, 3 Drawing Figures

METHOD FOR FABRICATING A PRINTED CIRCUIT BOARD OF DESIRED SHAPE

BACKGROUND OF THE INVENTION

The present application relates to electronic circuit boards and, more particularly, to a novel method for fabricating a printed circuit board of a desired shape.

Known methods for batch-fabricating printed circuit boards tend to work best on a flat substrate. Most printed circuit fabrication devices, such as screen printers, automatic part insertion machines, wave soldering machines and drying and baking ovens can normally only be utilized with flat-substrate printed circuit boards. However, the printed circuit board must often have a desired shape which is other than flat and most conventional techniques for fabricating printed circuit boards do not allow for the board to be formed after the circuit has been fabricated and parts mounted thereon. For example, conventional glass-epoxy or phenolic printed circuit boards cannot be bent to any great degree without cracking and will not hold a bent shape even if bent by only a small amount. Similar substrates, such as porcelain-coated steel or alumina are essentially completely rigid and will break if bent to any degree. While there are techniques for fabricating flexible circuits utilizing plastic substrate sheet material, the resulting flexible substrates do not have sufficient rigidity to hold a particular form and a second substrate member must usually be provided to maintain the shape of the flexible circuits.

It is therefore desirable to provide a printed circuit board upon which conductor patterns and electronic components can be mounted while the board is in a flat shape and allowing subsequent bending of the substrate to achieve a desired shape, without substrate, conductor or component damage.

BRIEF SUMMARY OF THE INVENTION

In accordance with the invention, a printed circuit board of a desired shape is fabricated by providing a flexible insulative layer upon at least one surface of a bendable rigid conductive substrate member, forming a pattern of conductors upon a free surface of the insulative layer, mounting components to the conductor pattern and then bending the flat substrate to a desired shape without damaging the conductor pattern and components thereon.

Accordingly, it is an object of the present invention to provide a novel method for forming a printed circuit board of a desired shape from a flat substrate.

This and other objects of the present invention will become apparent upon consideration of the following detailed description, when read in conjunction with the drawings.

DETAILED DESCRIPTION OF THE INVENTION

Figure 1:
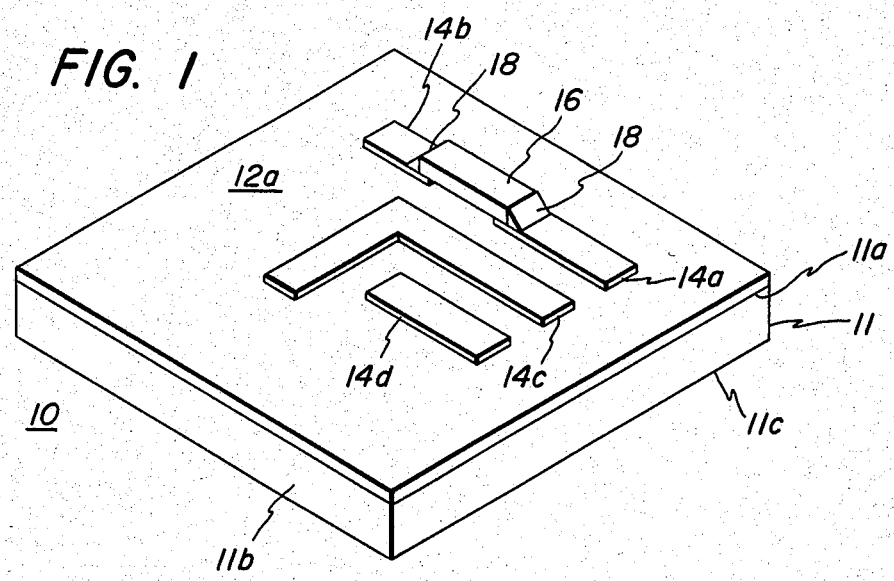
FIG. 1 is a perspective view of a flat printed circuit board substrate and of the conductors and components thereon, prior to the completion of the method of the present invention.

Referring to the Figures, a printed circuit board is fabricated from an initially flat substrate 11, formed of a material which will maintain its shape after a forming operation. Advantageously, a conductive substrate material, such as steel, aluminum, copper and the like, is utilized. A layer 12 of an insulative material is formed upon one surface 11a of the conductive substrate. The material of insulative layer 12 must: be sufficiently flexible to allow forming after it has been applied to the flat substrate surface 11a; have sufficient dielectric voltage-withstand capability to withstand operating voltages in the proposed printed circuit application, with an adequate safety margin and at the thickness of the insulative layer; properly adhere to the substrate 11 and provide a base to which printed circuit conductors can themselves adhere; and maintain the foregoing characteristics during other necessary processing steps, such as curing of subsequent circuit layers and soldering of components to circuit conductors, as well as withstand the thermal and humidity stresses over the life of the printed circuit board to be formed. Presently preferred insulative materials include polyimides, amide imides, Ultem ® polyetherimide resins and flexibilized epoxy resins. The chosen insulator material can be roll coated onto substrate surface 11a or may be screen printed only in those areas of surface 11a where required, due to the relatively expensive nature of these materials. These materials do, however, provide dielectric withstand voltages of about 4,000 volts per milli-inch of thickness and also demonstrate excellent adhesion to aluminum, steel, and copper substrates, with adequate forming flexibility. Other high-performance wire enamels can also be used.

After dielectric layer 12 is fabricated and properly cured, a pattern of conductors 14, e.g. conductive segments 14a–14d, is fabricated upon the top, free surface 12a of the layer. Advantageously, conductors 14 are fabricated by the augmentative-replacement of copper upon the surface of a metallic-powder-loaded ink, as more fully described and claimed in co-pending application Ser. No. 220,342, filed on Dec. 29, 1980 (now U.S. Pat. No. 4,404,237), assigned to the assignee of the present application and incorporated herein by reference in its entirety.

After fabrication of the desired pattern of circuit conductors 14, at least one circuit component 16 can be attached thereto, as by means of solder deposits 18 and the like. Component 16 may include chip components, such as capacitors, resistors and the like, integrated circuits and transistors, in package or die form, and other needed components having the leads thereof bonded in any desired manner to the appropriate conductors 14. It should be understood that, while FIG. 1 shows a single electronic circuit, multiple batch-fabricated circuits can be obtained by printing the conductor 14 pattern in an array on a large-area substrate and with subsequent separation of the individual completed circuits from the array.

Figure 2:
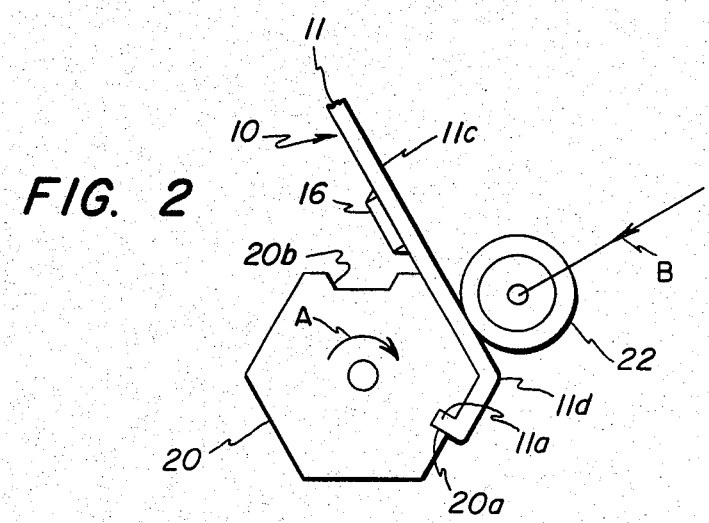
FIG. 2 is an end view of the substrate of FIG. 1 during formation into a desired shape, in accordance with the principles of the present invention.
Figure 3:
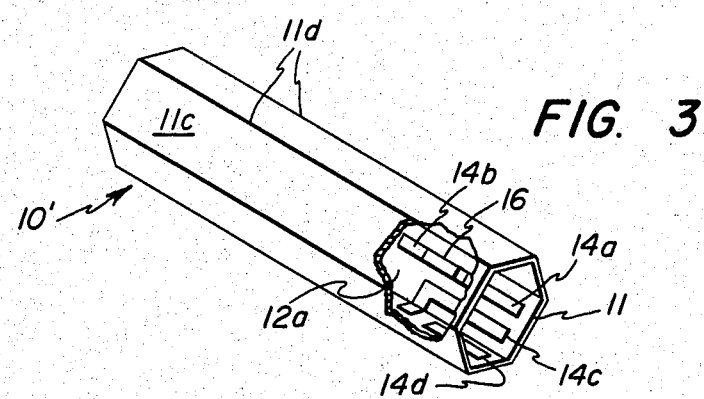
FIG. 3 is a partially-sectioned perspective view of a printed circuit board shaped in accordance with the method of the present invention.

An individual electronic printed circuit board 10 is, after separation from a batch-fabricated array thereof, then formed to the desired shape (FIG. 2). Illustratively, the desired shape is a hexagonal tube having the conductors 14 and components 16 positioned upon the interior surface thereof. The use of a shape having a multiplicity of flat-surfaced sides, rather than a tubular shape of continuously-curved topology, is desirable to provide flat areas where large chip and integrated circuit components may be mounted, to prevent bending stresses from breaking connections to these components. An area of the printed circuit board 10 adjacent to one substrate edge 11b is kept clear of components, for insertion into a holding slot 20a of a forming tool 20. As illustrated for forming the hexagonal printed circuit board 10' (FIG. 3), tool 20 has a corresponding hexagonal shape. Suitable indentations 20b are provided on the forming tool surfaces to cradle components 16 attached to the printed circuit board connectors. Thus, after insertion of substrate end 11b into forming tool slot 20a, the tool 20 is rotated in the direction of arrow A, and a member 22 applies presssure, in the direction of arrow B, against the substrate bottom surface 11c, to bend the substrate, as along line 11d, and form the desired final printed circuit board shape.

By way of example only, a hexagonal tube printed circuit board 10' was fabricated by coating a clean, but otherwise untreated, steel substrate 11 with duPont Pyre ML ® insulating enamel, using a rod wound with 60 mil wire. The coated substrate was then cured by drying for 10 minutes at 150° C., then baking for 20 minutes at 200° C., with a final 20-minute bake at 300° C. to finish fabrication of insulative layer 12 upon substrate 11.

Thereafter, conductors 14 were printed on the insulative substrate by utilizing a conductor ink in which 6.66 grams of the Pyre ML ® polyimide insulating resin was mixed with 20 grams of a metallic powder. The metallic powder was fabricated of about 70 percent by weight of powdered nickel and about 30 percent by weight of powdered iron, both with particle size of about $-325$ mesh. The conductive ink thus formed was then screen printed to form a desired conductor pattern. The ink pattern was then dried for 10 minutes at 150° C. and cured by a 15-minute bake at 200° C. and a 20-minute bake at 300° C. The insulated substrate with its conductor pattern was then dipped in a solution of copper sulphate, as described in the aforementioned co-pending patent application, and a contiguous layer of copper was formed on the patterned conductor ink. A resistor ink was printed over the conductors to form printed resistor elements. The resulting 2-inch by 3-inch substrate was then bent around a hexagonal form to form finished printed circuit board 10' of the desired shape. Measurements upon the conductors showed no measurable change in resistance due to bending.

While a presently preferred embodiment of our present invention is described in some detail herein, many modifications and variations will now become apparent to those skilled in the art. It is our intent, therefore, to be limited only by the scope of the appending claims and not by the specific details and instrumentalities utilized by way of description of the presently preferred embodiment herein.

What is claimed is:

1. A method for fabricating a printed circuit board with a desired three-dimensional shape, comprising the steps of:
   (a) providing a bendable rigid conductive substrate member having at least a first surface;
   (b) then completely fabricating a continuous flexible insulative layer upon substantially all of the substrate member first surface;
   (c) then completely forming a conductive pattern upon the free surface of the insulative layer; and
   (d) then lastly forming, without heating the substrate, insulative layer and conductive pattern combination to the desired three-dimensional shape with the substrate first surface being an interior surface of the shaped board and without damaging or reducing the continuity of the insulative layer, formed in step (b) and conductive pattern thereon.

2. The method of claim 1, further comprising the step of: mounting components to the conductive pattern prior to forming the printed circuit board substrate to the desired shape.

3. The method of claim 1, wherein the substrate is formed of a material selected from the group consisting of steel, aluminum and copper.

4. The method of claim 1, wherein the flexible insulative layer is a wire enamel.

5. The method of claim 1, wherein the insulative material is selected from the group consisting of polyimides, amide imides, polyetherimide resins and flexibilized epoxy resins.

6. The method of claim 1, wherein step (c) includes the steps of: providing a conductive ink having a quantity of a powdered metallic composition in a curable polymer; depositing the ink in the desired pattern; and contacting the surface of the ink with a solution selected to deposit a contiguous layer of a conductive material upon the surface of the ink.

7. The method of claim 1, wherein step (d) further comprises the steps of: providing a forming tool having a surface and a slot formed into the surface; placing an edge of the printed circuit board substrate into the forming tool slot; and causing the printed circuit board substrate to be pressed toward the tool surface to assume the desired shape.

8. The method of claim 7, wherein the causing step further comprises the steps of: rotating the forming tool; and applying pressure to the substrate to bend the substrate toward the tool to surface and assume the desired shape.

9. The method of claim 8, further comprising the steps of: securing components to the conductive pattern upon the insulative layer surface prior to shaping; and providing recesses upon the surface of the shaping tool to receive the components as the substrate is shaped.

10. The method of claim 1, wherein the desired shape is a closed curve, and step (d) includes the step of: providing at least a portion of the conductive pattern and components secured thereto upon the interior of the closed-curve-shaped printed circuit board.

11. The method of claim 10, further comprising the step of: forming the closed curve of a plurality of flat portions, each intersecting at least one adjacent portion at a bend edge therebetween, and step (d) includes the step of: forming at least one continuous portion of the conductive pattern to cross at least one of the interior corners formed at a bent edge between a pair of adjacent flat portions.

* * * * *